United States Patent
Katz (10) Patent No.: US 11,914,004 B2
(45) Date of Patent: Feb. 27, 2024

(54) CURRENT TRANSFORMER WITH EMBEDDED VOLTAGE FIELD DETECTION AND THERMAL SENSING

(71) Applicant: Anord Mardix (USA) Inc., Henrico, VA (US)

(72) Inventor: Alan H. Katz, Fair Oaks, CA (US)

(73) Assignee: ANORD MARDIX (USA) INC., Henrico, VA (US)

( * ) Notice: Subject to any disclaimer, the term of this patent is extended or adjusted under 35 U.S.C. 154(b) by 0 days.

(21) Appl. No.: 17/334,605

(22) Filed: May 28, 2021

(65) Prior Publication Data

US 2021/0373087 A1    Dec. 2, 2021

Related U.S. Application Data

(60) Provisional application No. 63/031,119, filed on May 28, 2020.

(51) Int. Cl.
*G01R 31/62* (2020.01)
*H02H 3/42* (2006.01)

(52) U.S. Cl.
CPC ............... *G01R 31/62* (2020.01); *H02H 3/42* (2013.01)

(58) Field of Classification Search
CPC .... G01R 15/142; G01R 15/165; G01R 15/18; G01R 31/62; H02H 3/42
USPC ......................................................... 324/726
See application file for complete search history.

(56) References Cited

U.S. PATENT DOCUMENTS

| | | | |
|---|---|---|---|
| 5,206,596 A | 4/1993 | Beihoff et al. | |
| 6,330,516 B1 | 12/2001 | Kammeter | |
| 7,453,267 B2 | 11/2008 | Westbrock, Jr. et al. | |
| 7,493,222 B2 | 2/2009 | Bruno | |
| 8,610,438 B1 | 12/2013 | Sykora et al. | |
| 9,069,009 B2 | 6/2015 | Nero, Jr. | |
| 9,270,552 B2 | 2/2016 | Jubinville et al. | |
| 9,329,659 B2 | 5/2016 | Cook | |

(Continued)

FOREIGN PATENT DOCUMENTS

CA    2558793 A1    3/2007

OTHER PUBLICATIONS

Electro Industries/GaugeTech—Nexus 1252 Performance Enhanced Energy and Power Quality Meter, http://www.electroind.com:80/nexus1252.htm, dated Dec. 13, 2013, 3 pgs.

(Continued)

*Primary Examiner* — Jermele M Hollington
*Assistant Examiner* — Courtney G McDonnough
(74) *Attorney, Agent, or Firm* — Fredrikson & Byron, P.A.

(57) ABSTRACT

A monitoring system for sensing electrical parameters including current and voltage can comprise a current transformer and an antenna. The current transformer can be configured to sense current passing through a conductor. The antenna can be configured to sense electrical potential of the conductor by sensing an electric field generated by the conductor. The antenna can sense the electrical potential independent of whether current is present in the conductor. The monitoring system can further comprise a temperature sensor configured to sense a temperature of the conductor. A sensing module can include a housing supporting the current transformer, the antenna, and the temperature sensor for monitoring an electrical power circuit.

25 Claims, 8 Drawing Sheets

(56) References Cited

U.S. PATENT DOCUMENTS

| | | | |
|---|---|---|---|
| 9,689,899 | B2 | 6/2017 | Cook et al. |
| 11,137,421 | B1* | 10/2021 | Parker .................. G01R 15/181 |
| 2006/0069522 | A1 | 3/2006 | Bruno |
| 2006/0129339 | A1 | 6/2006 | Bruno |
| 2007/0194797 | A1* | 8/2007 | Ibuki ...................... G01R 15/16 |
| | | | 324/600 |
| 2010/0235122 | A1* | 9/2010 | McCrea ............... G01R 21/133 |
| | | | 324/140 R |
| 2012/0078680 | A1 | 3/2012 | Tharp |
| 2018/0031611 | A1 | 2/2018 | Lindsey et al. |

OTHER PUBLICATIONS

Electro Industries/GaugeTech—"Nexus 1252 Advanced Performance Power Meter and Data Acquisition Node" brochure, dated Apr. 2004, 16 pgs.

Electro Industries/GaugeTech—"EIG High-Performance Power Quality Monitoring", http:/www.electroind.com/nexustech3-52.html, dated Dec. 17, 2004, 3 pgs.

Lantronix—"UDS1100-IAP Industrial Device Server" brochure, dated Sep. 2006, 2 pgs.

Schneider Electric Power-monitoring units—"Circuit Monitor Series 4000" brochure, dated Jan. 18, 2018, 8 pgs.

Schneider Electric, "POWERLOGIC Branch Current Monitor (BCM42) Instruction Bulletin", Bulletin No. 63230-216-206/A2, dated Jan. 2001, 16 pgs.

Power Distribution, Inc. "Branch Circuit Monitoring System (BCMS)", Technical Guide, dated 2005, 2 pgs.

Power Distribution, Inc. "Branch Circuit Monitoring System Specification", specification sheet section 16620, dated 2005, 3 pgs.

Schneider Electric, "PowerLogic Energy and Power Management Systems," Catalog Section 4, dated 2009, 36 pgs.

Lantronix—"UDS10 UDS 100 User Guide," Revision A Part No. 900-360, dated Jun. 2004, 78 pgs.

Anord Mardix "Modular Circuit Monitoring System," brochure, dated 2018, 12 pgs.

Ausboard Electrical Switchboard Manufacturers "Branch Circuit Monitoring System Installation and Operation Manual for BCMS Plus," Revision 4 dated Oct. 25, 2011, 25 pgs.

* cited by examiner

CURRENT TRANSFORMER WITH EMBEDDED VOLTAGE FIELD DETECTION AND THERMAL SENSING

RELATED APPLICATIONS

This application claims priority to U.S. Patent Application No. 63/031,119 filed May 28, 2020, the entire contents of which are incorporated herein by reference.

BACKGROUND

In many electrical systems, electrical power is diverted from a utility source to one or more branch circuits via a panelboard. Each of the branch circuits supply power to one or more loads. Protective devices, such as circuit breakers, are typically installed at the panelboard to reduce the risk of electrical overloads and short circuits. An overload may occur when one or more loads draws more power from a branch circuit than the branch circuit was rated to carry.

In typical installations, there may be numerous panelboards and associated branch circuits, and an electrician must be aware of the loads on each circuit to properly configure each protective device and load combination. Current transformers (CTs) can be installed and commissioned on each branch circuit at the panelboard. Each of the installed CTs may operate to provide a current output signal indicative of the current flow in the respective branch circuit.

CTs generally comprise a step-down ratio, wherein a measured primary current is stepped down to a secondary current by the step-down ratio to produce a more manageable and/or safer signal which can be used for further analysis and examination. CTs may be configured to step down currents to standardized values, such as to 1 or 5 Amperes. Exemplar step-down ratios are 240:5 and 120:1. CTs typically consist of a conductive core surrounding by a plurality of windings from a conductive wire. In such instances, the conductive core carries the primary current, the conductive wire carries the secondary current, and CTs step down ratio is related to the number of windings of the conductive wire.

Previous models of CTs require current to be actively flowing through the system to receive accurate measurements. However, components throughout an electrical system can fail when circuits are closed as well as when they are open. Thus, a need exists for a branch circuit monitor system which improves the analysis branch circuits to quickly and effectively identify arising issues in all conditions.

SUMMARY

This disclosure generally describes a monitoring system configured to sense two or more electrical parameters in an electrical power circuit. The monitoring system can comprise a current transformer configured to sense a first electrical parameter. The first electrical parameter can be the electrical current present in a power circuit conductor. The monitoring system can also comprise an antenna configured to sense a second electrical parameter. The second electrical parameter can be an electric field generated by the power circuit conductor with the electrical field being related to the electrical potential present in the power circuit conductor. The antenna can sense the electrical potential present in the power circuit conductor independent of whether electrical current is present in the power circuit conductor. The monitoring system can further comprise a sensing module which includes a housing having a outer housing wall and an inner housing wall. The inner housing wall can define an inner opening of the sensing module and can be configured to permit the power circuit conductor of the electrical power circuit to pass therethrough. The current transformer can be supported by the housing of the sensing module.

A sensing module system configured to sense electrical parameters in an electrical power circuit is also described. The sensing module system can comprise a plurality of sensing modules with each of the plurality of sensing modules configured to sense two or more electrical parameters of a unique power circuit conductor of the electric power circuit. The sensing module system can also comprise a base supporting the plurality of sensing modules. Each of the sensing modules can comprise a housing which includes an outer housing wall, and an inner housing wall. The inner housing wall can define an inner opening of the sensing module and can be configured to permit the unique power circuit conductor to pass therethrough. Each of the plurality of sensing modules can also comprise a current transformer supported by the housing and configured to sensing a first electrical parameter. The first electrical parameter can be the electrical current present in the unique power circuit conductor passing through the inner opening. The plurality of sensing modules can also comprise an antenna supported by the housing and configured to a sense a second electrical parameter. The second electrical parameter can be an electric field generated by the unique power circuit conductor and is related to the electrical potential present in the unique power circuit conductor. The antenna can sense the electrical potential present in the unique power circuit conductor independent of whether electrical current is present in the unique power circuit conductor.

BRIEF DESCRIPTION OF DRAWINGS

The following drawings are illustrative of particular embodiments of the invention and therefore do not limit the scope of the invention. The drawings are not necessarily to scale (unless so stated) and are intended for use with the explanations in the following detailed description. Embodiments of the invention will hereinafter be described in conjunction with the appended drawings, wherein like numerals denote like elements.

DETAILED DESCRIPTION

The following detailed description is exemplary in nature and is not intended to limit the scope, applicability, or configuration of the invention in any way. Rather, the following description provides some practical illustrations for implementing various embodiments of the present invention. Those skilled in the art will recognize that many of the noted examples have a variety of suitable alternatives.

Figure 1:
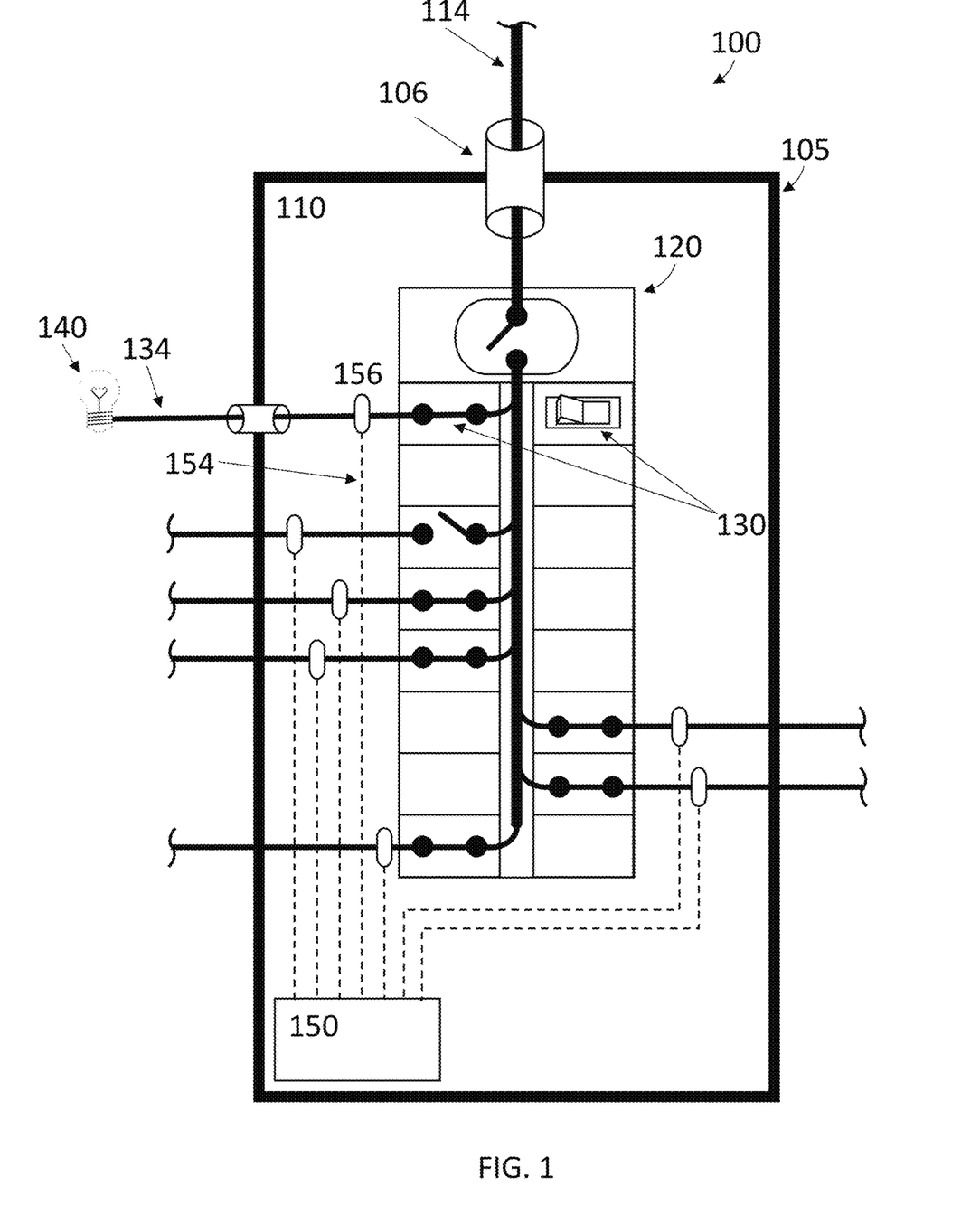
FIG. 1 illustrates an exemplary circuit breaker monitoring system.

FIG. 1 shows a general overview of a circuit breaker monitoring system 100 that may employ one or more embodiments of inventive sensing modules as described herein. The circuit breaker monitoring system 100 may comprise a housing 105 configured to house one or more circuit breaker panelboards 110 and the like. The one or more circuit breaker panelboards 110 can be configured to control power flow to one or more circuits. The panelboard 110 may be additionally fed power from one or more power lines, such as power line 114. As shown, the panelboard 110 may be configured to receive power from a source external to housing 105 via a conduit 106 or the like. It is noted that depending on the embodiment, power line 114 may comprise a plurality of power lines. Power line 114 may provide alternating current (AC) and/or direct current (DC) to the panelboard 110, such as to distribute power to one or more loads 140 via branch circuits 134. In some embodiments, power line 114 may comprise various alternating current systems, such as a four wire Wye system, a three wire Delta system, a Phase-to-Phase system, a Single Phase system, or any other configurations known to one of ordinary skill in the art. For instance, many household applications in the United States comprise two hot power lines comprising 120 volts and one neutral line.

Panelboard 110 may include a main circuit breaker 120 as well as one or more branch circuit breakers 130. The main circuit breaker 120 may be configured to control whether power is or is not flowing from power line 114 into the panelboard 110. In embodiments wherein power line 114 comprises a plurality of lines, the main circuit breaker 120 can be configured to turn off the incoming power from all of the lines, there may be a plurality of main circuit breakers for each respective line, or the like. The panelboard 110 may additionally comprise one or more branch circuit breakers 130 which are configured to control whether power is or is not flowing to various loads, such as load 140, connected via respective, individual branch circuits 134. Load 140 may comprise any load known to one of ordinary skill in the art, such as one or more devices which consume electric power to operate (e.g., one or more motors, lights, heaters, electronics, compressors, household appliances, or the like). It is noted that load 140 may represent a plurality of independent or dependent devices, such as multiple lights in a room, multiple household appliances, or the like.

The number of branch circuits 134 may vary depending on the number of circuits, the size of the panelboard 110, the number of loads 140 being supplied power by the panelboard 110, or the like. In exemplary embodiments, panelboard 110 may be configured to house sixteen circuits as shown in FIG. 1, however panelboard 110 may be configured to house various other amounts of circuits, such as 24, 48, 72, 96, or any amount known to one having ordinary skill in the art. In some embodiments, as shown in FIG. 1, not all branch circuit breakers 130 may be connected to loads. For instance, one or more branch circuits may be electrically connected to an electrical outlet, switch, or the like which at some points may not have a load 140 connected and/or may have a load 140 not currently receiving power.

In some embodiments, one or more of the branch circuits 134 can include one or more sensing modules 156. Furthermore, even though not explicitly shown in FIG. 1, the power line 114 may comprise one or more sensing modules 156, such as a sensing module for each phase, or the like. As described herein, sensing modules 156 may comprise a current transformer (CT), an antenna, a temperature sensor, and/or the like. Accordingly, the sensing module 156 can be configured to sense and measure one or more circuit parameters, such as current, electric field presence and/or intensity, electrical potential, and/or thermal conditions.

In some embodiments, the sensing modules 156 may be configured to provide information to one or more monitoring systems 150. Exemplary monitoring systems 150 may include a modular circuit monitoring system, such as Core Module™ Monitoring Systems provided by Anord Mardix, or the like. The one or more monitoring systems 150 may be located internal to housing 105, such as mounted on or near panelboard 110. Additionally or alternatively, the one or more monitoring systems 150 may be located external to housing 105, such as mounted adjacent to housing 105, in a common control or monitoring system location, or the like.

The monitoring system 150 may be configured to receive one or more signals from the sensing modules 156 via a communication link 154 and process the received data. As described herein, communication link 154 may comprise a variety of data communication connection types known to one of ordinary skill in the art, such as wired connections (e.g., ethernet, cable, etc.), wireless connections (e.g., Bluetooth, WiFi, LiFi, NFC, etc.).

As shown in FIG. 1, circuit breaker monitoring system 100 may comprise one or more sensing modules 156 to monitor one or more circuit breakers 130 of interest on panelboard 110. In some embodiments, the sensing modules 156 may be mounted, attached, or free standing within panelboard 110. For example, one or more sensing modules may be mounted directly to panelboard 110, enclosed within housing 105, or the like.

Figure 2A:
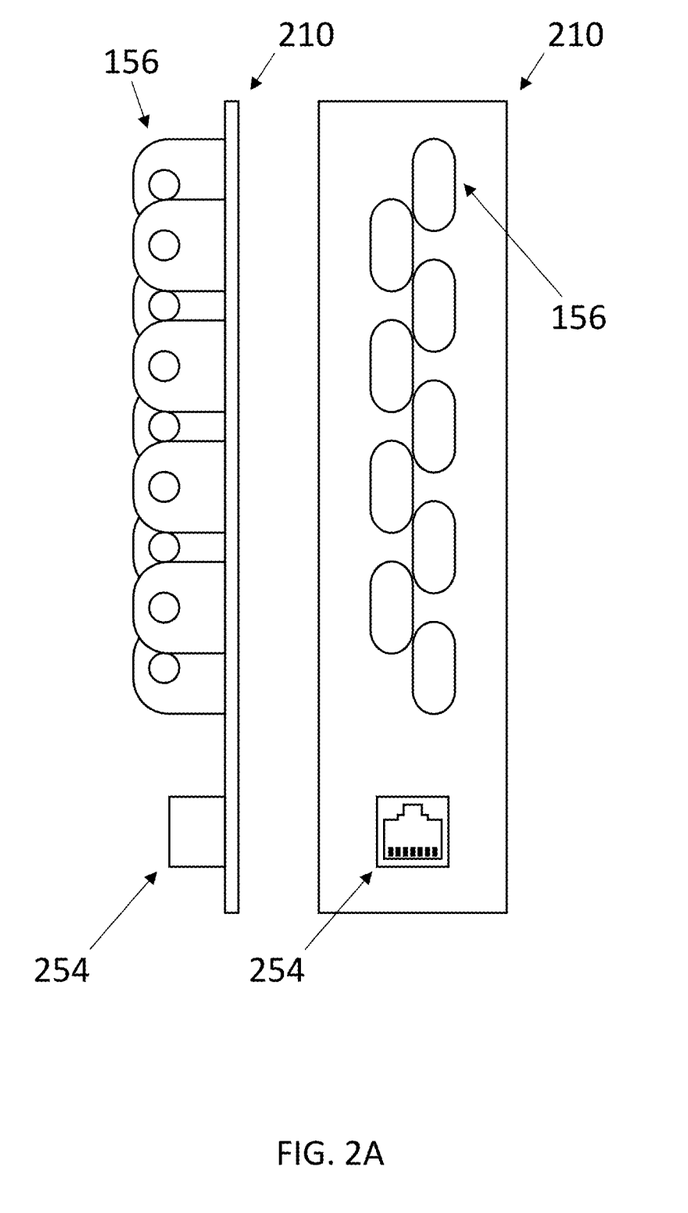
FIG. 2A-2B provide exemplary configurations of a plurality of sensing modules.

FIG. 2A provides an exemplary embodiment wherein the one or more sensing modules 156 are orientated in a spatially-aligned array on a base 210 (e.g., a printed circuit board or the like). In some embodiments, the sensing modules can be mounted in a linear or coplanar orientation to facilitate space efficient monitoring of circuit breakers (e.g., branch circuit breakers 130). As discussed further herein, the sensing modules 156 may be configured to monitor the current, the presence and/or amount of voltage, and/or the thermal status of circuit breakers on panelboard 110. As shown in FIG. 2A, the one or more sensing modules 156 may be additionally configured to communicate information to a monitoring system (e.g., monitoring system 150) via a common communication port 254.

Figure 2B:
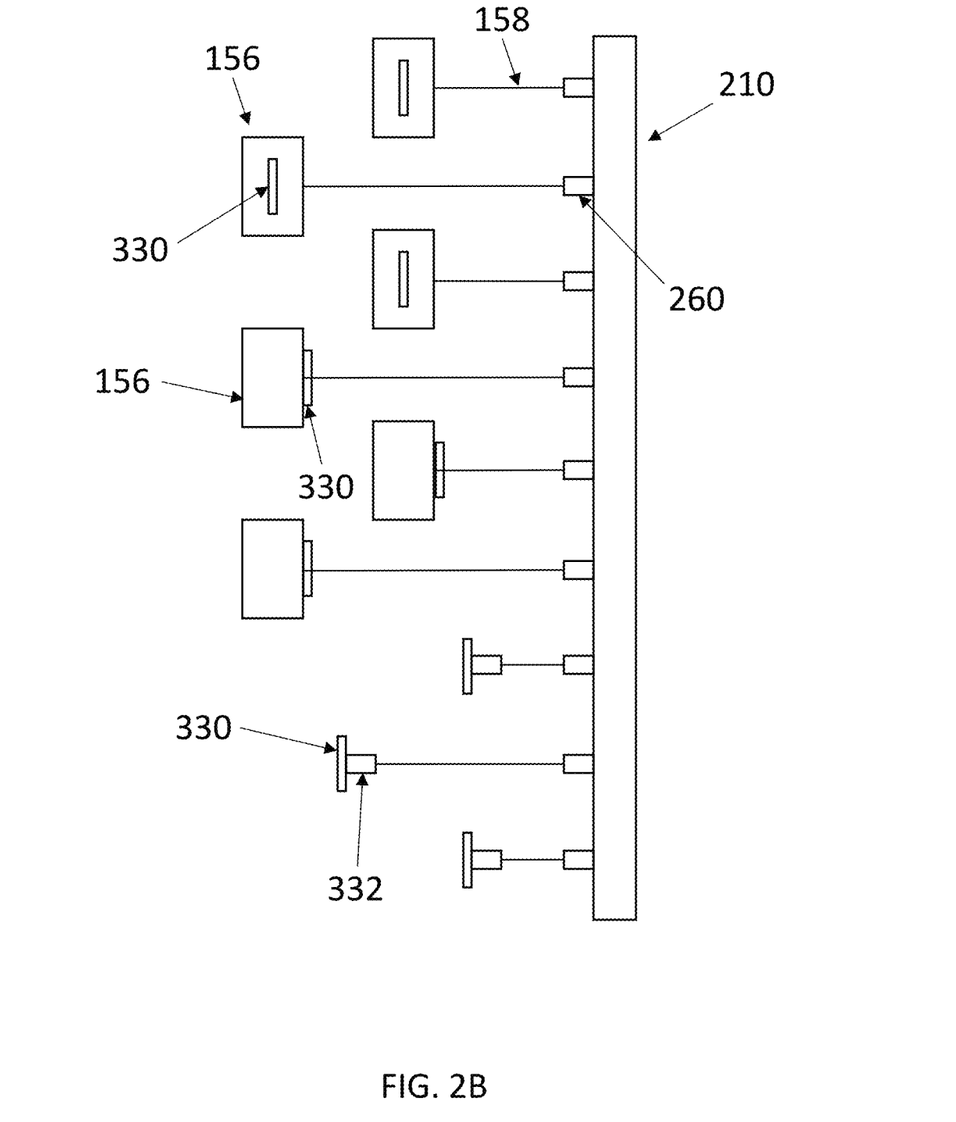

In comparison to FIG. 2A, FIG. 2B provides an alternative embodiment wherein the one or more sensing modules 156 are not mounted on a circuit board, but are instead connected to a base 210 (e.g., a printed circuit board or the like) via flexible wires 158. While illustrated as a single line between the base 210 and the sensing module 156 or antenna 330, the flexible wires 158 can comprise a single wire or multiple wires. In some embodiments, the one or more flexible wires 158 comprise a twisted pair of wires. The flexible wires can connect to the base directly, however, in FIG. 2B, the flexible wires 158 can connect to the base 210 via connectors 260. The connectors 260 are spaced regularly in the illustrated embodiment, but need not be. By using flexible wires, the sensing modules 156 can be moved easily and can accommodate conductors (e.g., branch circuit 134) which are not spaced evenly and/or are located varying distance from a sensing circuit. In similarity with FIG. 2A, the base 210 of FIG. 2B can be configured to communicate information to a monitoring system (e.g., monitoring system 150) via a common communication port or other means.

In some examples, the circuit breaker monitoring system can comprise antennas 330 which are also connected to the base 210 and are described in further detail elsewhere herein. As illustrated in FIG. 2B, antennas 330 can be located inside of the sensing module 156, outside the sensing module, or can be completely distinct from the sensing module 156. For example, in FIG. 2B, a portion of the antennas 330 are not connected to a sensing module 156 and are therefore not connected to a CT. In some examples, all the antennas are located in a similar manner, for instance, located inside of a sensing module.

In some examples, a signal conditioner, comprising circuitry and/or a processor, can be used to perform operations on a signal generated by the sensing modules 156 and/or the antennas 330. For example, the signal conditioner can be used to convert signals from the antennas 330 into digital signals. Other operations are also contemplated such as signal processing. The signal conditioner can help reduce electrical interference, for example, by conditioning or otherwise processing signals generated by the sensing modules 156 and/or antennas 330, which may degrade signals which are traveling over the flexible wires 158 to the base 210. In some examples, the signal conditioner is located within or proximate to the sensing modules 156. However, in examples which do not include a sensing module, such as illustrated in the lower portion of FIG. 2B, the signal conditioner 332 can be in communication with the antenna 330 and connected proximate thereto.

Figure 3:
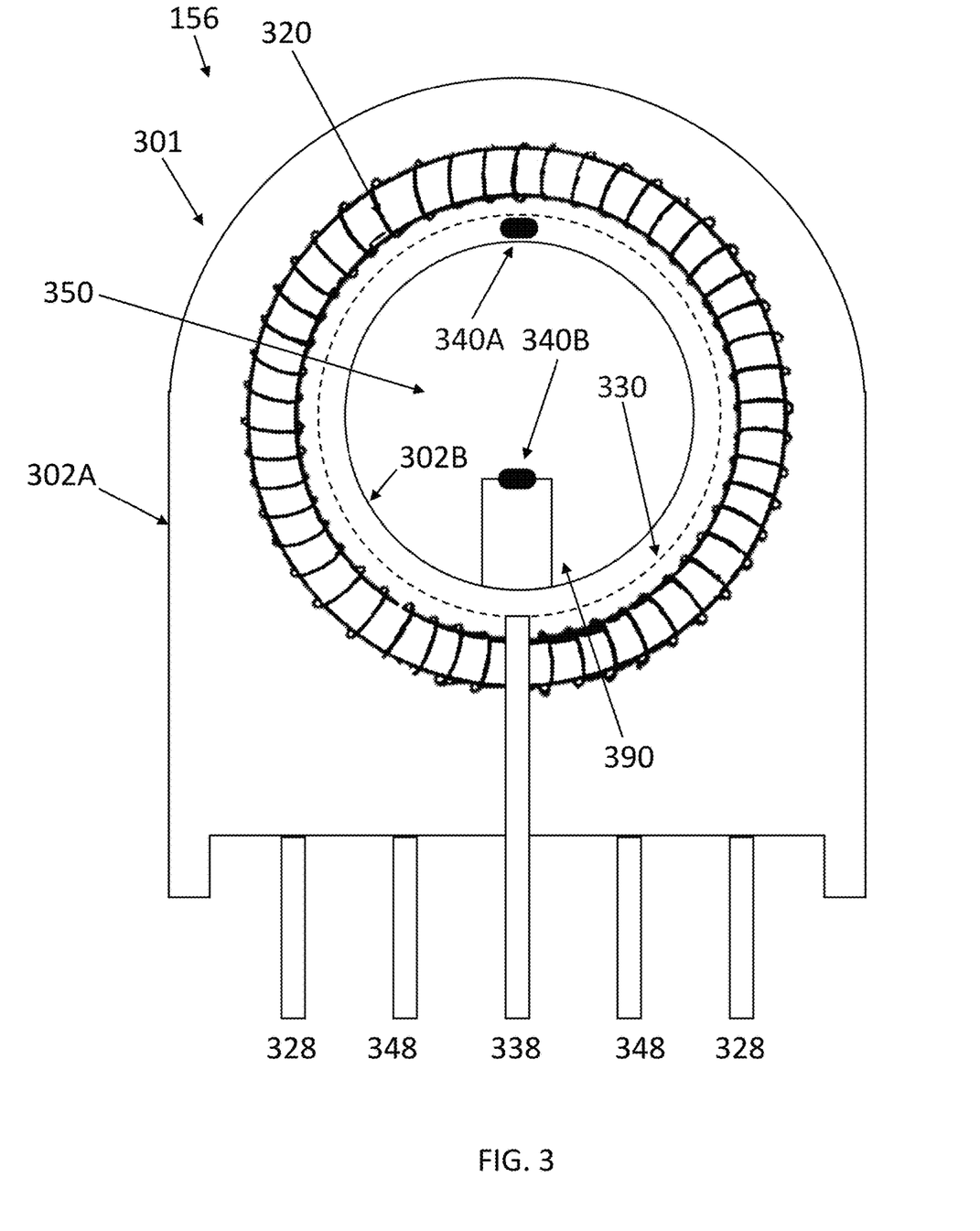
FIG. 3 provides a cross-sectional view of an exemplary sensing module.

FIG. 3 provides an exemplary sensing module 156. Sensing module 156 may be configured to detect a magnitude of current in AC circuits, the presence and/or intensity of an electric field, and/or the thermal status of a corresponding circuit (e.g., branch circuit 134). As shown, the sensing module 156 may comprise a housing 301 configured to house various components as described herein. Housing 301 may comprise an external housing wall 302A as well as an internal housing wall 302B. As shown in FIG. 3, the internal housing wall 302B may define an interior opening 350 running through the sensing module 156. In some examples, the interior opening 350 may be configured to house a conductor (e.g., branch circuit 134 wire, one or more wires, and/or the like).

Sensing module 156 may comprise a current transformer (CT) 320. In some embodiments, the CT 320 may encircle the interior opening 350 such as to monitor current present therein. The CT 320 may comprise various modalities of current transformers known to one of ordinary skill in the art, such as a wound type CT, solid core CT, or the like. In some example configurations, such as in FIG. 2A, the CT of the sensing module 156 can alternatively comprise a split-core CT. In some embodiments, CT 320 may comprise a step-down ratio, wherein the CT 320 is configured to receive high current values (e.g., from a conductor in the interior opening 350) and then reduce the received high current values by the step-down ratio to current magnitudes which are more easily monitored by monitoring system 150.

CTs may be configured to step down currents to standardized values, such as 1 or 5 amperes and/or be configured to step down by predefined ratios, such as 120:1 or 24:1. In some embodiments, CT 320 may comprise a primary coil and a secondary coil, wherein a step-down ratio is determined by the ratio of windings on the primary coil and the secondary coil. In such embodiments, the primary coil may comprise a single conductive core (corresponding to one winding), and the secondary coil may comprise a conductive wire wrapped around the single conductive core.

In some embodiments, sensing module 156 may be configured to detect the temperature of one or more wires (e.g., branch circuit 134 wire) running through the interior opening 350. Accordingly, the sensing module 156 may comprise one or more temperature sensors (e.g., temperature sensor 340A and/or temperature sensor 340B). Temperature sensors described herein may comprise one or more devices configured to sense ambient temperature and/or surrounding thermal energy, such as thermocouples, resistive temperature devices (RTDs, thermistors), infrared radiators, bimetallic devices, liquid expansion devices, silicon diodes, and/or the like.

The temperature sensor 340 may be located adjacent to the inner housing wall 302B, be flush with inner housing wall 302B, be located within the interior opening 350, be located within housing 301, or the like. Additionally or alternatively, the temperature sensor 340 may be located outside the housing 301 and the interior opening 350 of sensing module 156, such as on an independent substrate, circuit board, or the like. FIG. 3 provides two exemplary temperature sensor configurations, with temperature sensor 340A being located adjacent to inner housing wall 302B and temperature sensor 340B being located within the interior opening 350.

To provide accurate temperature readings, it may be advantageous to have the temperature sensor 340 located close to the one or more wires passing through the CT. In some embodiments, a spring-loaded tongue 390 may be used to help position any conductor or the like present in the interior opening 350 close to or against the temperature sensor. In some examples, this may comprise using the spring-loaded tongue 390 to push the conductor towards the temperature sensor (e.g., temperature sensor 340A). Additionally or alternatively, the temperature sensor (e.g., temperature sensor 340B) may be integrated into the spring loaded tongue 390 such that the temperature sensor is held close to or against the one or more wires passing through the CT.

As shown in FIG. 3, sensing module 156 may comprise an antenna 330. The antenna 330 may allow the sensing module 156 to detect an electric field induced by the presence of an electrical potential present in the conductor (e.g., branch circuit 134 wire). For example, in some embodiments, a capacitance of the antenna can change based on an electric field produced by an energized conductor. In some such examples, the change in the capacitance of the antenna can be amplified to create a signal that is discernable to detect when a potential is applied to the conductor. Accordingly, the sensing module 156 can be configured to determine if the branch circuit 134 is energized and/or the status of a circuit breaker or switch connected to the branch circuit (e.g., circuit breaker 130).

Advantageously, the use of antenna 330 can reduce or even negate the need of auxiliary contacts to be present on the circuit breakers (e.g., circuit breakers 130). As known by one having ordinary skill in the art, traditional panelboard systems include complementary auxiliary contacts for each circuit breaker to determine the status of said circuit breaker (e.g., whether it is tripped or not). However, the inclusion of auxiliary contacts may concur additional costs and further take up valuable space on the panelboard (e.g., panelboard 110) resulting in a reduction of the total amount of circuit breakers which can be installed. Accordingly, this means that a larger panelboard and/or additional panelboards would be necessary to house all the circuit breakers. Such configurations could prove to be more costly to the user and/or be difficult to implement in compact areas.

Additionally, the use of an antenna to detect a potential can be advantageous in other applications beyond a panelboard with circuit breakers. For instance, the antenna can be used to determine whether any conductor has a varying potential regardless of if the conductor is connected to a load. For example, an antenna can be used to determine if a conductor connected to a switch has a varying potential and/or if it is energized even if the conductor is not passing current through it (e.g., to a load). Such a use can be advantageous over systems which require a load to be connected and/or require a current to flow through a conductor to determine if the conductor is energized as more information can be determined about the systems with fewer steps and with no connected load.

As described herein, sensing module 156 may comprise an embedded antenna 330 that can be configured to detect the presence of an electric field in the interior opening 350, such as an electric field emanating from branch circuit 134. In some embodiments, antenna 330 may be configured to detect the presence of an electric field in a plurality of conditions, such as when current is and/or is not flowing through branch circuit 134. As discussed herein, the integration of a current sensing system and an electric field sensing system in sensing module 156 may advantageously reduce the space required to monitor circuit breakers (e.g., circuit breakers 130) located on panelboard 110.

As shown in FIG. 3, antenna 330 may encircle the interior opening 350. Furthermore, in some embodiments comprising both CT 320 and antenna 330, CT 320 may encircle antenna 330 such that antenna 330 is located between internal housing wall 302B and CT 320. Additionally or alternatively, antenna 330 may be located elsewhere, such as between CT 320 and external housing wall 302A, within inner opening 350, adjacent the external housing wall 302A, or the like. In embodiments wherein the antenna 330 is located within interior opening 350, the antenna 330 may still encircle the conduit and be isolated (e.g., galvanically isolated or the like) from the conduit. In some embodiments comprising antenna 330 and temperature sensor 340A, temperature sensor 340A may be located between antenna 330 and the internal housing wall 302B, such as shown in FIG. 3.

As described herein, antenna 330 may be configured to detect whether or not an electric field is present within interior opening 350. In other words, antenna 330 may be configured to detect the presence and/or magnitude of an electric field produced by a conductor passing through the interior opening 350. In some embodiments, antenna 330 detects the electric field via non-contact methods, such as by being galvanically isolated from the conductor. Antenna 330 may be configured to detect the electric field for conductors of various sizes and shapes (e.g., any sized wire) capable of passing through the interior opening 350 and/or conductors passing through the interior opening 350 at various angles (e.g., normal to the side face of sensing module 156, or the like). A person having ordinary skill in the art will appreciate that the antenna 330 can include various designs and is not limited to any one specific design. For example, the antenna 330 may comprise a wire or wires which vary in size, shape, material or the like. Some such examples include a wire bent in a loop with an opening sized to fit a conductor. Other such examples include a straight wire. It can be advantageous, however, for the antenna 330 to be located proximate the conductor so that the antenna 330 can receive the best signal with the least amount of electrical noise.

Figure 4A:
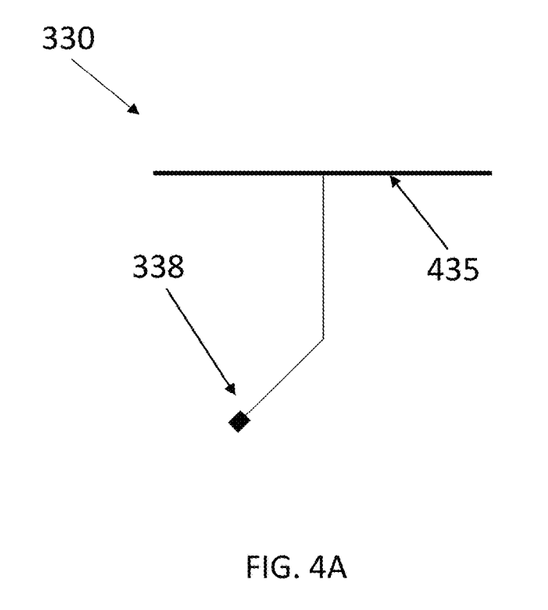
FIGS. 4A-4D illustrate various components of a sensing module.

FIG. 4A provides a schematic of antenna 330. As shown in FIG. 4A, antenna 330 may comprise a wire 435. In some examples, the wire 435 can be a loop of wire which can encircle the interior opening 350. Additionally or Alternatively, in some embodiments, the antenna can comprise an antenna array mounted on a flexible printed circuit board (e.g., 330 of FIG. 5). In some such embodiments, the antenna array may encircle the interior opening 350. The wire 435 of the antenna 330 can comprise any electrically conductive material (e.g., copper) which can enable the antenna 330 to measure the surrounding electrical field (e.g., an electrical field emanating from the conductor passing through the interior opening 350). Furthermore, antenna 330 may be configured to provide (e.g., to monitoring system 150 or the like) a signal representative of the surrounding electrical field via lead 338.

In some embodiments, having the antenna span the entire circumference of the interior opening 350 may optimize detection of an electrical field emanating from a conductor, which may result in a more accurate electrical potential reading or the like. Additionally or alternatively, the spring loaded tongue 390 may be configured to position a conductor closer to the antenna to provide a more accurate detection of the electric field produced (or lack thereof) by said conductor.

Figure 4B:
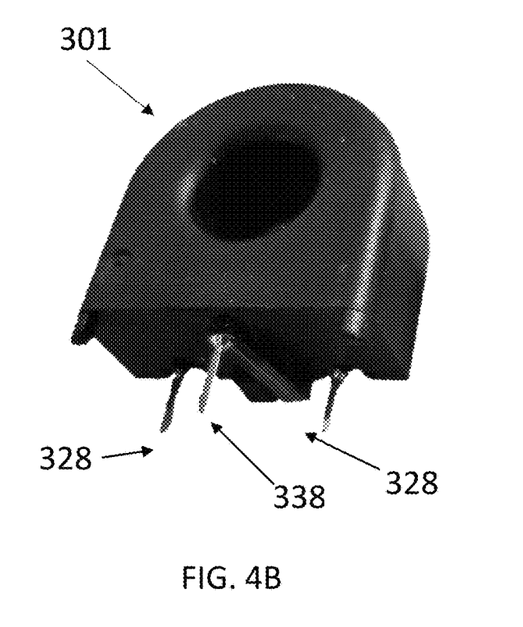
Figure 4C:
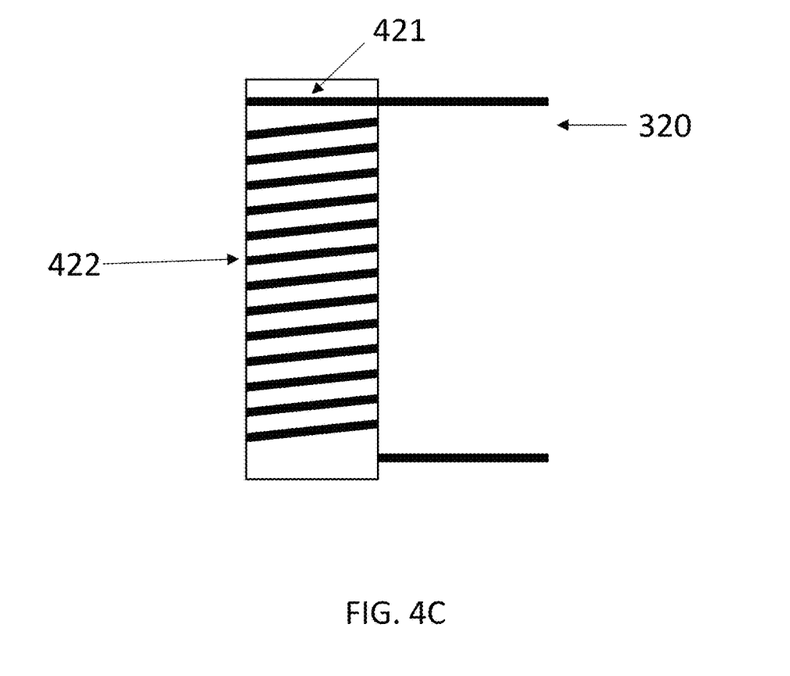
Figure 4D:
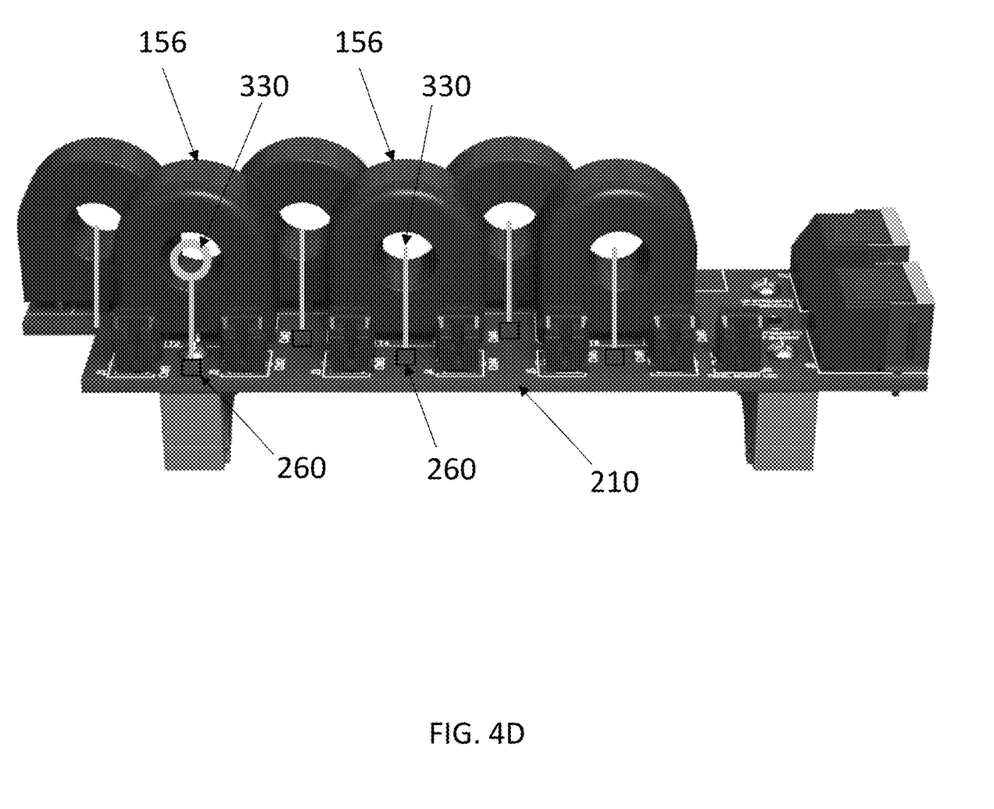

FIG. 4D provides an example embodiment illustrating the mounting of antennas 330 externally to the sensing module 156. In the illustrated example, the antennas 330 are located in proximity to where the conductors (e.g., branch circuit 134) pass through the sensing modules 156. In some embodiments, the antennas 330 can be affixed directly to the conductors, for instance, via mechanical means (e.g., clasps, adhesive). The antennas 330 are also connected to the base 210 via one or more connectors 260. However, in some embodiments, the antennas are directly connected to the base 210 (e.g., via soldering). As described elsewhere herein, the antennas 330 can take any shape include a loop of wire and a straight wire as illustrated in FIG. 4D. The antennas 330 of FIG. 4D are additionally aligned with their corresponding sensing modules 156. While alignment of the antennas is not necessary, it can help prevent the antennas from receiving errant signals from nearby conductors.

A dynamic gain adjustment circuit (not shown) can be used to attenuate the signal from antenna 330 to optimize the antenna for specific voltages. In some embodiments, the dynamic gain adjustment circuit may be located external to sensing module 156, such as in monitoring system 150 or the like.

Sensing module 156 may comprise a plurality of connection points configured to communicate data. In some embodiments, sensing module 156 may be configured to communicate data from the connection points to monitoring system 150 (e.g., via communication link 154). As shown in FIG. 3, sensing module 156 may comprise one or more current transformer leads 328, one or more antenna leads 338, and/or one or more thermal sensor leads 348. In some embodiments, each lead may connect to a separate communication link (e.g., separate wire) to transfer data to the monitoring system 150 or one or more signals may be sent over a common wire, common bus, a common wireless signal, or the like. In some embodiments, as shown in FIG. 2A, each of the connection points (e.g., leads 328-348) for a plurality of sensing modules may connect to a common bus and transmit data via common communication port 254.

In some embodiments, the current transformer leads 328 may provide a current signal representative of the magnitude of current flowing through the interior opening 350 (e.g., from branching circuit 134) as described herein. Similarly, the antenna leads 338 and the thermal sensor leads 348 may provide a signal representative of the electrical potential inside the interior opening 350 and the temperature present within the interior opening 350, respectively.

Figure 5:
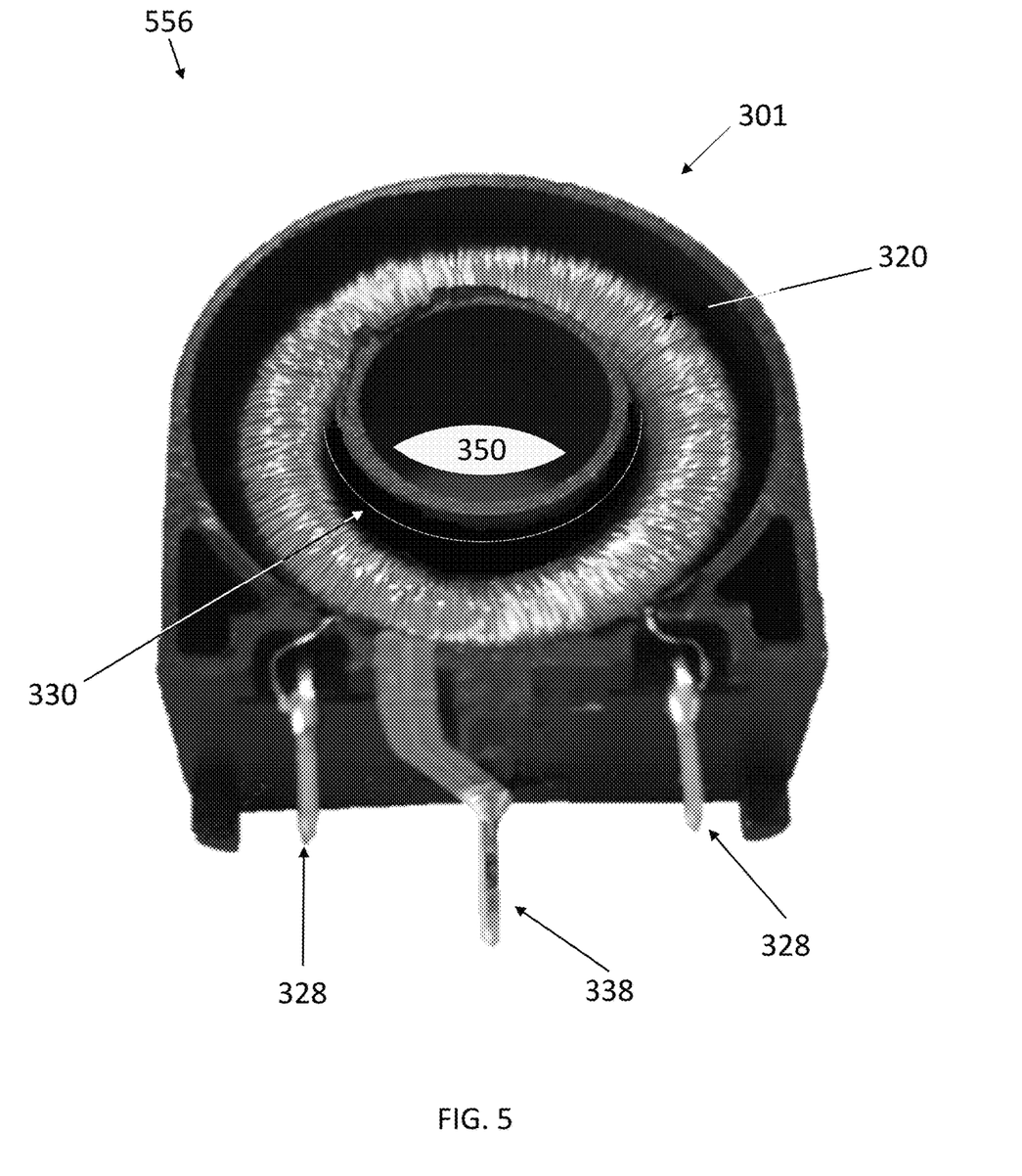
FIG. 5 illustrates an exemplary sensing module.

FIG. 5 provides an exemplary sensing module 556, similar to the sensing module 156 shown in FIG. 3. Sensing module 556 includes housing 301. Housing 301, as also shown in FIG. 4B, can be made out of a variety of materials known to one of ordinary skill in the art, such as plastic (e.g., epoxy), metal, a combination thereof, or the like. Sensing module 556 may additionally include CT 320. As best shown in FIG. 4C, CT 320 may comprise a ferrite core 421 wound with copper winding 422. It is noted that as described herein, various other materials may be used for core 421, and windings 422, such as those known to one of ordinary skill in the art.

Sensing module 556 may additionally comprise antenna 330 as described herein. As shown in FIGS. 4A and 5, antenna 330 may be situated on a flexible circuit board (PCB). Sensing module 556 may additionally include a plurality of leads, such as leads 328 and 338 to transmit one or more signals to an external source, such as monitoring system 150. As described herein, leads 328 may be configured to transmit a signal regarding any current information sensed by CT 320 and lead 338 may be configured to transmit a signal regarding any electrical potential sensed by antenna 330. In some embodiments, the sensed current and/or electrical potential may be from a conductor (e.g., branch circuit 134, one or more wires, and/or the like) running though the interior opening 350 of sensing module 556.

Figures 6A, 6B:
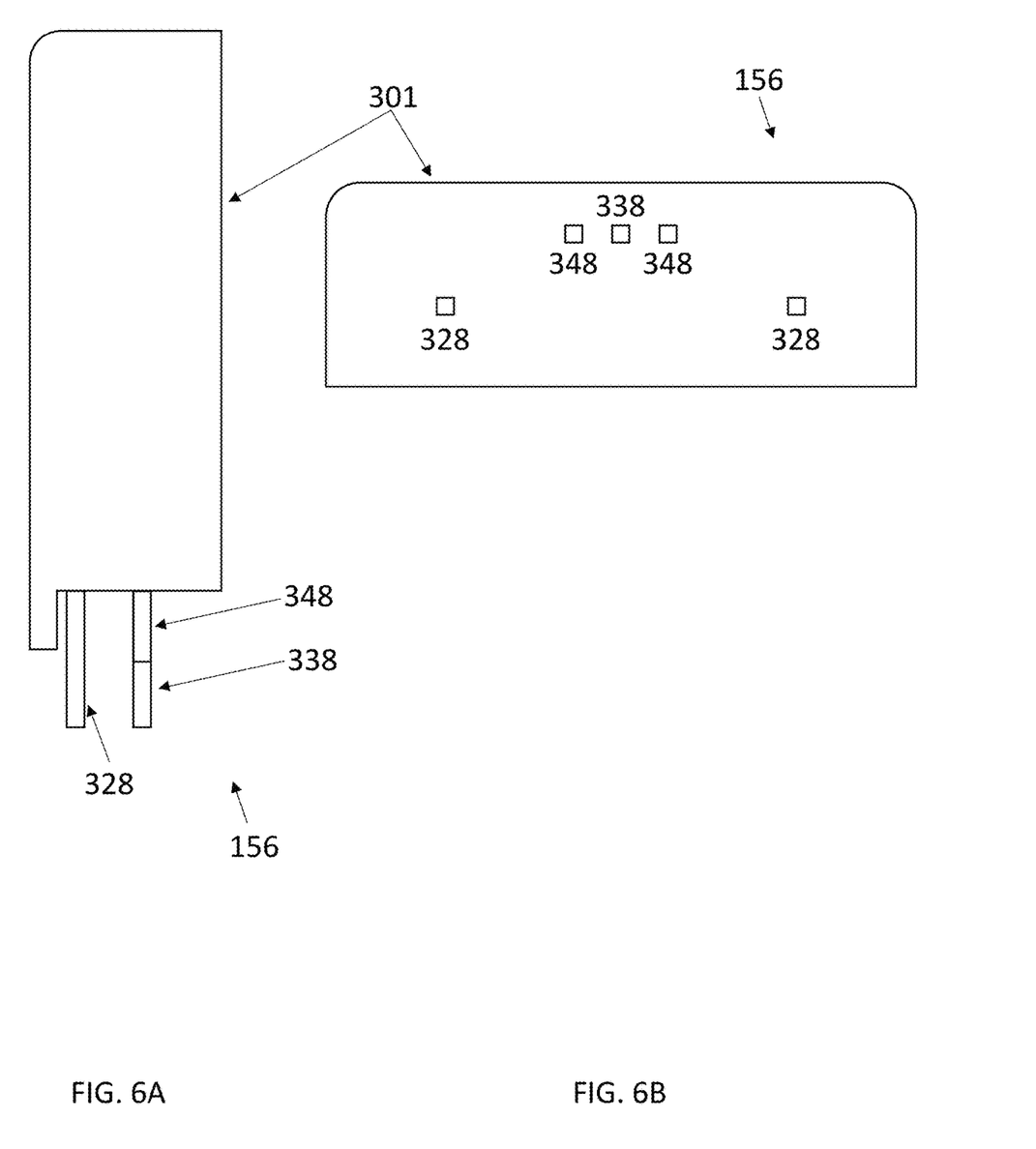
FIGS. 6A and 6B provides various view angles the exemplary sensing module shown in FIG. 3.

FIGS. 6A and 6B provide various other views of exemplary sensing module 156. For instance, FIG. 6A illustrates a side view and FIG. 6B provides a bottom view. It is noted that the configuration of sensing module 156 in FIG. 3 as well as 6A-6C are exemplary in nature and various modifications to the sensing module as shown have been contemplated. For example, difference sizes, shapes, configurations, and types of components can be used.

In some embodiments, monitoring system 150 can comprise various computational components such as a processor, one or more types of memory, and the like. Furthermore, monitoring system 150 can comprise one or more inputs, such as inputs configured to receive information from one or more sensing modules 156 via communication link 154. Additionally or alternatively, monitoring system 150 may comprise a variety of other ports suitable for sending and receiving data. For example, monitoring system 150 can comprise one or more ports one or more digital I/O ports, serial ports, and/or ethernet ports. The digital I/O ports, serial ports, and/or ethernet ports may comprise any suitable ports known to one of ordinary skill in the art.

The processor of monitoring system 150 can be configured to analyze signals received from the sensing modules 156 and then determine one or more operating parameters. In some embodiments, the processor may receive information (e.g., from internal memory, from the sensing modules 156, or the like) and be further configured to analyze the received data and determine if one or more actions should be performed. The one or more actions may comprise adjusting the power flow in one or more branch circuits 134, such as by adjusting the state of one or more circuit breakers (e.g., branching circuit breakers 130, main circuit breaker 120). In some examples, the processing (e.g., analyzing signals, determining operating parameters) can be performed by different processors which can be located on various portions of the circuit breaker monitoring system. For example, a portion of the processing can be performed on processor located on a base (e.g., 210) which can be separate from the monitoring system 150. In some such examples, the base can send a signal to the monitoring system 150 indicating the presence of voltage on one of the conductors (e.g., branch circuits monitored). Throughout this disclosure, signals and data transmitted between components (e.g., processors) can be sent via binary signals and/or by communication protocols such as ModBus, BACnet, SNMP, REST API, MQTT, optical, RF or other communication protocols.

Processors as described herein can comprise one or more processors, such as one or more microprocessors, digital signal processors (DSPs), application specific integrated circuits (ASICs), field programmable gate arrays (FPGAs), programmable logic circuitry, or the like, either alone or in any suitable combination. Processors may also include memory that stores program instructions and related data that, when executed by the processor, cause the monitoring system 150 and processor to perform the functions attributed to them in this disclosure as well as any functions known to one of ordinary skill in the art. Memory as described herein can include any volatile or non-volatile on board memory, such as chip-based memory, SSD drive-based memory, hard drive-based memory, or the like. Additionally or alternatively, memory may include any fixed or removable magnetic, optical, or electrical media, such as RAM, ROM, CD-ROM, magnetic disks, EEPROM, removable media (e.g., SD, mini-SD, micro-SD, USB, external hard drives, etc.), or the like. In some embodiments, removable memory may be insertable/removable via a memory slot. A removable memory may also allow any received data from the sensing modules 156 to be easily transferred to another computing device, or the like. Processors may also be implemented as a System on a Chip that integrates some or all components of a computer or other electronic system into a signal chip. The processor 710 (processing circuitry) can be configured to communicate the processed data to a display or other a different output/control device.

Various embodiments have been described. Such examples are non-limiting, and do not define or limit the scope of the invention in any way.

The invention claimed is:

1. A monitoring system configured to sense two or more electrical parameters in an electrical power circuit, comprising:
   a sensing module comprising:
      a housing having an outer housing wall and an inner housing wall, the inner housing wall defining an inner opening of the sensing module, the inner opening configured to permit a power circuit conductor of the electrical power circuit to pass therethrough;
      a current transformer (CT) supported by the housing and configured to output a signal representative of a quantity of electrical current present in a power circuit conductor passing through the inner opening; and
      an antenna supported by and embedded inside the housing and configured to sense an electric field generated by the power circuit conductor, the electric field related to the electrical potential present in the power circuit conductor, whereby
      the antenna senses the electrical potential present in the power circuit conductor passing through the inner opening independent of whether electrical current is present in the power circuit conductor.

2. The monitoring system of claim 1, wherein the power circuit conductor is a conductor of a branch circuit in the electrical power circuit.

3. The monitoring system of claim 1, wherein the antenna encircles the inner opening and the CT encircles the inner opening.

4. The monitoring system of claim 3, wherein the antenna is positioned between the inner housing wall and the CT.

5. The monitoring system of claim 1, wherein the sensing module further comprises one or more leads, the one or more leads configured to provide a signal representative of at least one of the electrical current or the electric field measured by the sensing module.

6. The monitoring system of claim 5, wherein the one or more leads comprises:
a CT lead, the CT lead being configured to provide a signal representative of the electrical current present in the power circuit conductor; and
an antenna lead, the antenna lead being configured to provide a signal representative of the electric field generated by the power circuit conductor.

7. The monitoring system of claim 5, further comprising:
a plurality of sensing modules, each of the plurality of sensing modules being configured to monitor a unique power circuit conductor of the electrical power circuit; and
a base, the base supporting the plurality of sensing modules and comprising a common communication port; wherein
each of the plurality of sensing modules is communicatively coupled to the common communication port via the one or more leads.

8. The monitoring system of claim 7, further comprising a detection system, wherein:
the detection system is communicatively coupled to the common communication port; and
the plurality of sensing modules are communicatively coupled with the detection system via the common communication port.

9. The monitoring system of claim 1, wherein the antenna is galvanically isolated from the power circuit conductor.

10. The monitoring system of claim 1, further comprising a temperature sensor, the temperature sensor configured to measure a temperature of the power circuit conductor.

11. The monitoring system of claim 10, wherein the temperature sensor comprises at least one of: a thermocouple, a resistive temperature device, a thermistor, an infrared radiator, a bimetallic device, a liquid expansion device, and a silicon diode.

12. The monitoring system of claim 10, wherein the temperature sensor is within the inner opening.

13. The system of claim 1, further comprising a detector system in electrical communication with the current transformer and the antenna, the detector system configured to receive signals representative of the amount of electrical current present in the power circuit conductor from the current transformer and signals representative of the presence of electrical potential in the power circuit conductor from the antenna.

14. The system of claim 13, wherein the antenna comprises a single lead configured to carry a signal from the antenna to the detector system.

15. A sensing module system configured to sense electrical parameters in an electrical power circuit, comprising:
a plurality of sensing modules, each of the plurality of sensing modules configured to sense two or more electrical parameters of a unique power circuit conductor of the electrical power circuit, each of the plurality of sensing modules comprising:
a housing, the housing comprising:
an outer housing wall,
an inner housing wall, the inner housing wall defining an inner opening of the sensing module, the inner opening configured to permit the unique power circuit conductor to pass therethrough;
a current transformer (CT) supported by the housing, the CT configured to sense a first electrical parameter, the first electrical parameter being the electrical current present in the unique power circuit conductor passing through the inner opening; and
an antenna supported by and embedded inside the housing, the antenna configured to sense a second electrical parameter, the second electrical parameter being an electric field generated by the unique power circuit conductor, the electric field related to the electrical potential present in the unique power circuit conductor passing through the inner opening, whereby
the antenna senses the electrical potential present in the unique power circuit conductor independent of whether electrical current is present in the unique power circuit conductor; and
a base, the base supporting the plurality of sensing modules.

16. The sensing module system of claim 15, wherein:
each of the plurality of sensing modules comprises one or more leads, the one or more leads configured to provide information regarding the two or more electrical parameters to an external monitoring system.

17. The sensing module system of claim 16, wherein the base comprises a common communication port, wherein:
the common communication port is communicatively connected to each of the one or more leads from the plurality of sensing modules; and
the common communication port is communicatively connected to the external monitoring system; such that
the external monitoring system receives the information regarding the two or more electrical parameters from the one or more leads via the common communication port.

18. The sensing module system of claim 15, wherein the plurality of sensing modules are arranged in a spatially-aligned array on the base.

19. A method of sensing two or more electrical parameters in an electrical power circuit, comprising:
attaching a housing around a power circuit conductor of the electrical power circuit such that the power circuit conductor passes through an inner opening of the housing;
outputting a signal representative of a quantity of a first electrical parameter of the power circuit conductor via a current transformer (CT) supported by the housing and positioned around the power circuit conductor, the first electrical parameter being an electrical current present in the power circuit conductor;
sensing a second electrical parameter of the power circuit conductor via an antenna supported by and embedded within the housing, the second electrical parameter being an electric field generated by the power circuit conductor, wherein
the electric field is related to electrical potential present in the power circuit conductor, and the antenna senses the electrical potential present in the power circuit conductor independent of whether electrical current is present in the power circuit conductor.

20. The method of claim 19, wherein the power circuit conductor is a conductor of a branch circuit in the electrical power circuit.

21. The method of claim 19, wherein the antenna comprises an antenna array.

22. The method of claim 19, wherein the housing has:
an outer housing wall, and an inner housing wall, the inner housing wall defining the inner opening of the housing.

23. The method of claim 22, wherein the antenna and CT encircle the inner opening.

24. The method of claim 23, wherein the antenna is positioned between the inner housing wall and the CT.

25. The method of claim 19, further comprising:
sensing a third electrical parameter of the power circuit conductor via a temperature sensor, the third electrical parameter being the temperature of the power circuit conductor.

\* \* \* \* \*